United States Patent
Takeguchi et al.

(10) Patent No.: US 7,732,815 B2
(45) Date of Patent: Jun. 8, 2010

(54) SEMICONDUCTOR THIN FILM, THIN FILM TRANSISTOR, METHOD OF MANUFACTURING THE SEMICONDUCTOR THIN FILM, METHOD OF MANUFACTURING THE THIN FILM TRANSISTOR, AND MANUFACTURING DEVICE OF SEMICONDUCTOR THIN FILM

(75) Inventors: Toru Takeguchi, Tokyo (JP); Shinsuke Yura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 157 days.

(21) Appl. No.: 11/836,312

(22) Filed: Aug. 9, 2007

(65) Prior Publication Data
US 2008/0048187 A1 Feb. 28, 2008

(30) Foreign Application Priority Data
Aug. 28, 2006 (JP) .............................. 2006-231054

(51) Int. Cl.
*H01L 29/10* (2006.01)
*H01L 29/76* (2006.01)
*H01L 31/112* (2006.01)

(52) U.S. Cl. ........................................ 257/66; 438/486
(58) Field of Classification Search .................. 257/66
See application file for complete search history.

(56) References Cited

U.S. PATENT DOCUMENTS

| 2002/0008093 A1* | 1/2002 | Ukita et al. ............. 219/121.72 |
| 2003/0010762 A1* | 1/2003 | Koide ..................... 219/121.73 |
| 2005/0023531 A1* | 2/2005 | Shoji et al. ..................... 257/70 |
| 2005/0026401 A1* | 2/2005 | Shimomura et al. .......... 438/487 |
| 2006/0223333 A1* | 10/2006 | Li et al. ...................... 438/762 |

FOREIGN PATENT DOCUMENTS

| CN | 1365513 A | 8/2002 |
| JP | 2003-17505 | 1/2003 |

OTHER PUBLICATIONS

"Pulsed laser crystallization and doping for thin film transistors." J.B. Boyce, J.P. Lu, J. Ho, R.T. Fulks, P. Mei* (* = corresponding author); Journal of Non-Crystalline Solids 266-269 (2000) 1252-1259. Xerox Palo Alto Research Center, Palo Alto, CA 94304.*

Y. Nakata, et al., "Crystallization of an a-Si film by a Nd:YAG pulse laser beam with linear polarization", TFT3-3, AM-LDC 2000, pp. 265-268.

* cited by examiner

*Primary Examiner*—Thao X Le
*Assistant Examiner*—Geoffrey Ida
(74) *Attorney, Agent, or Firm*—Oblon, Spivak, McClelland, Maier & Neustadt, L.L.P.

(57) ABSTRACT

A semiconductor thin film according to an embodiment of the present invention includes: a polycrystallized semiconductor thin film formed by applying laser light to an amorphous semiconductor thin film; and crystal grains arranged into a lattice shape with a size that is about ½ of an oscillation wavelength of the laser light.

16 Claims, 5 Drawing Sheets

SEMICONDUCTOR THIN FILM, THIN FILM TRANSISTOR, METHOD OF MANUFACTURING THE SEMICONDUCTOR THIN FILM, METHOD OF MANUFACTURING THE THIN FILM TRANSISTOR, AND MANUFACTURING DEVICE OF SEMICONDUCTOR THIN FILM

BACKGROUND OF THE INVENTION

1. Field of the Invention

The present invention relates to a semiconductor thin film and a thin film transistor which have a high degree of crystal orientation, a method of manufacturing the same, and a manufacturing device of a semiconductor thin film.

2. Description of Related Art

A liquid crystal display device (LCD) as a typical example of existing thin panels is a power-saving, compact, and lightweight device. The LCD has been widely used for a monitor of a personal computer or a monitor of a portable information terminal device by utilizing the features. In recent years, the LCD has found its application in the field of television, and replaced conventional cathode-ray tube. However, the LCD has a problem that view angle and contrast are limited and high-speed response for displaying moving pictures is difficult. As a next-generation thin panel device that overcomes the above problem, an EL display device has been used. This device is a electroluminescence type display device that uses a light emitter such as an EL element for a pixel display portion. As described above, the EL display device is self-luminous with wide view angle, high contrast, and high-speed response as features that the LCD does not have.

In the display devices, a thin film transistor (TFT) is used as a switching element. As the TFT, a MOS TFT with a semiconductor thin film has been frequently used. The TFTs are classified into an inverted staggered type, a top-gate type, and the like, and the semiconductor thin films are classified into an amorphous semiconductor thin film and a polycrystalline semiconductor thin film. An appropriate one is selected therefrom in accordance with applications and performances of the display device. Many small panels employ a polycrystalline semiconductor thin film because an aperture ratio of a display region can be increased, and a TFT can be downsized. As a method of forming the polycrystalline semiconductor thin film, an amorphous semiconductor thin film is first formed on a silicon oxide film ($SiO_2$ film) as a base film, and then applied with laser light to turn the semiconductor thin film into a polycrystalline film (see Japanese Unexamined Patent Application Publication No. 2003-17505).

As another known method, the polycrystalline semiconductor thin film is formed and then a TFT is manufactured. More specifically, a gate insulating film made of $SiO_2$ or the like is formed on a polycrystalline semiconductor thin film to form a gate electrode. Next, impurities such as P (phosphorus) and B (boron) are doped into the polycrystalline semiconductor thin film through a gate insulating film to form source/drain regions. Further, the source/drain regions mean conductive regions containing impurities in the polycrystalline semiconductor thin film. The source region is connected to a source electrode, and the drain region is connected to a drain electrode later. Here, a region between the source/drain regions is a channel region. Subsequently, an interlayer insulating film is formed to cover the gate electrode and the gate insulating film. Then, a contact hole is formed in the interlayer insulating film and the gate insulating film to reach the source/drain regions of the polycrystalline semiconductor thin film. A metal film is formed on the interlayer insulating film and patterned to be connected to the source/drain regions formed in the polycrystalline semiconductor film to thereby form the source/drain electrodes. After that, a pixel electrode or EL element is formed to be connected with the drain electrode to thereby complete a TFT.

Further, in the case of forming a polycrystalline semiconductor thin film by a known method of applying a laser to an amorphous semiconductor thin film, crystal grains having a random size of about 0.2 to 1.0 um are arranged in the formed film. If a TFT is manufactured with a polycrystalline semiconductor thin film having various crystal grain sizes (crystal size), TFT characteristics vary because the number or size of crystal grains in a channel varies in accordance with a position of the TFT. For that reason, TFT characteristics vary. In the case of using a TFT having varying characteristics in a pixel or peripheral driving circuit, a voltage or a current written to each pixel thereof varies. The variations look like display unevennesses to a user, and display characteristics are deteriorated.

Thus, studies have been made of how to equalize randomly varying sizes of crystal grains and suppress variations in TFT characteristics. For example, "AM-LCD2000" (Y. Nakata, A. Shimoyama and S. Horita, p 265-268) describes that second harmonics of Nd:YAG laser (hereinafter referred to as "YAG-$2\omega$ laser") are applied while a substrate is kept at 350° C. in a vacuum chamber, and then the substrate is rotated by 90° and irradiated with YAG-$2\omega$ laser again to thereby obtain crystal grains that are arrayed in a lattice shape at almost regular intervals. In the case of manufacturing a TFT with the thus-formed polycrystalline semiconductor thin film, the size or number of crystal grains in a channel can be equalized. Thus, variations in TFT characteristics are supposedly suppressed.

However, this method requires irradiation of the semiconductor thin film with the laser twice and thus is inappropriate to mass production. Further, the resultant crystal grain size is about 0.5 um that is substantially equivalent to a laser emission wavelength. Such a large crystal grain size causes deterioration of TFT reliability. This is because carriers accelerated by an externally applied electric field are repeatedly ionized by collision at a crystal grain boundary or in crystal grains to form an electron-hole pair. Alternatively, an internal defective level that is caused by enforced growth of crystal is increased, leading to deterioration in characteristics.

SUMMARY OF THE INVENTION

The present invention has been accomplished with a view to solving the above problems, and it is an object of the present invention to provide a semiconductor thin film and a thin film transistor where crystal grains are arranged in a lattice shape at regular intervals with a small grain size, a method of manufacturing the same, and a manufacturing device of a semiconductor thin film.

A semiconductor thin film according to an aspect of the present invention includes: a polycrystallized semiconductor thin film formed by applying laser light to an amorphous semiconductor thin film; and crystal grains arranged into a lattice shape with a size that is about ½ of an oscillation wavelength of the laser light.

Further, a method of manufacturing a semiconductor thin film according to another aspect of the present invention includes: forming an amorphous semiconductor thin film over a substrate; and irradiating the amorphous semiconductor thin film with laser light to form a polycrystallized semiconductor thin film including crystal grains arranged into a lattice shape with a size that is about ½ of an oscillation wavelength of the laser light.

A manufacturing device of a semiconductor thin film, according to an aspect of the present invention includes: a laser light emitting device applying laser light to an amorphous semiconductor thin film to arrange crystal grains in a polycrystallized semiconductor thin film in a lattice shape with a size that is about ½ of an oscillation wavelength of the laser light, the amorphous semiconductor thin film being polycrystallized if applied with the laser light; and a circular polarizing element circularly polarizing the laser light from the laser light emitting device.

According to the present invention, it is possible to provide a semiconductor thin film and a thin film transistor where crystal grains are arranged in a lattice shape at regular intervals with a small grain size, a method of manufacturing the same, and a manufacturing device of a semiconductor thin film.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE PREFERRED EMBODIMENTS

Embodiment

Figure 1:
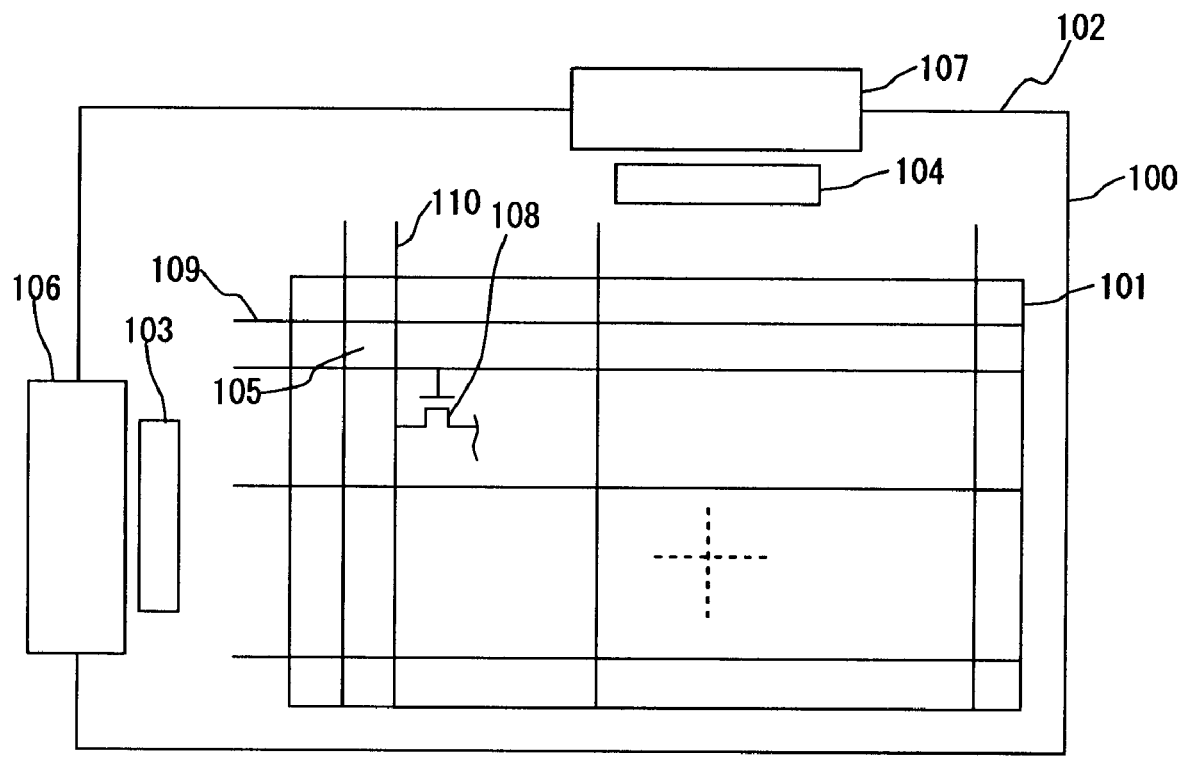
FIG. 1 is a schematic plan view of the structure of a TFT array substrate.

Referring to FIG. 1, a TFT array substrate using a thin film transistor (TFT) according to an embodiment of the present invention is described first. FIG. 1 is a schematic plan view of the structure of the TFT array substrate. Further, the TFT array substrate is used for a flat panel display device such as a liquid crystal display device or an EL display device. Further, the EL display devices are classified into an organic EL display device and an inorganic EL display device.

A TFT array substrate 100 has a display region 101 and a frame region 102 surrounding the display region 101. In the display region 101, plural gate signal lines (scanning signal line) 109 and plural source signal lines (display signal lines) 110 are formed. The plural gate signal lines 109 are arranged in parallel. Likewise, the plural source signal lines 110 are arranged in parallel. The gate signal lines 109 and the source signal lines 110 cross each other. The gate signal lines 109 and the source signal lines 110 are orthogonal to each other. A region between the gate signal line 109 and the source signal line 110 which are adjacent to each other is a pixel 105. Thus, the pixels 105 are arranged in matrix in the TFT array substrate 100.

Further, the frame region 102 of the TFT array substrate 100 includes a scanning signal driving circuit 103 and a display signal driving circuit 104. The gate signal line 109 extends from the display region 101 to the frame region 102. Then, the gate signal line 109 is connected with the scanning signal driving circuit 103 at the end of the TFT array substrate 100. The source signal line 110 similarly extends from the display region 101 to the frame region 102. Then, the source signal line 110 is connected to the display signal driving circuit 104 at the end of the TFT array substrate 100. The external line 106 is connected near the scanning signal driving circuit 103. Further, the external line 107 is connected near the display signal driving circuit 104. The external lines 106 and 107 constitute, for example, a wiring board such as an FPC (Flexible Printed Circuit).

Various signals are externally supplied to the scanning signal driving circuit 103 and the display signal driving circuit 104 through the external lines 106 and 107. The scanning signal driving circuit 103 supplies a gate signal (scanning signal) to the gate signal line 109 in accordance with an external control signal. The gate signal lines 109 are successively selected in accordance with the gate signal. The display signal driving circuit 104 supplies a display signal to the source signal lines 110 in accordance with the external control signal or display data. As a result, a display voltage corresponding to the display data can be applied to each pixel 105. Incidentally, the scanning signal driving circuit 103 and the display signal driving circuit 104 are not limited to the above structure where the circuits are formed on the TFT array substrate 100. For example, a driving circuit may be connected by a TCP (Tape Carrier Package).

In each pixel 105, at least one TFT 108 is formed. The TFT 108 is formed in the vicinity of an intersection of the source signal line 110 with the gate signal line 109. For example, the TFT 108 supplies a display voltage to the pixel electrode. The gate electrode of the TFT 108 as a switching element is connected to the gate signal line 109, and the TFT 108 is turned ON/OFF under control in accordance with a signal input from a gate terminal. The source electrode of the TFT 108 is connected to the source signal line 110. If a voltage is applied to the gate electrode, a current flows from the source signal line 110. As a result, a display voltage is applied to the pixel electrode connected to the drain electrode of the TFT 108 from the source signal line 110. Then, an electric field corresponding to the display voltage is generated between the pixel electrode and an opposing electrode.

Further, an opposing substrate is arranged opposite to the TFT array substrate 100 in a liquid crystal display device. The opposing substrate is, for example, a color filter substrate and is placed on the display screen side. On the opposing substrate, a color filter, a black matrix (BM), the opposing electrode, and an orientation film are formed. Incidentally, the opposing electrode is placed on the TFT array substrate 100 side, for example, in an IPS-type liquid crystal display device. Then, a liquid crystal layer is formed between the TFT array substrate 100 and the opposing substrate. That is, a liquid crystal is filled in between the TFT array substrate 100 and the opposing substrate. Further, a polarizing plate and a retardation plate are placed on the outer surfaces of the TFT array substrate 100 and the opposing substrate. Further, a backlight unit or the like is arranged on the opposite side to the display screen of the liquid crystal panel.

A liquid crystal is driven by an electric field generated between the pixel electrode and the opposing electrode. That is, an orientation direction of the liquid crystal between the substrates is changed. As a result, a polarized state of light transmitted through the liquid crystal layer is changed. That is, a polarized state of the light that was turned into linearly-polarized light through the polarizing plate is changed by the liquid crystal layer. More specifically, light from a backlight unit and external light are turned into linearly-polarized light by the polarizing plate. Then, a polarized state is changed by the linearly-polarized light passing through the liquid crystal layer.

Accordingly, an amount of light transmitted through the polarizing plate on the opposing substrate side is changed in accordance with the polarized state. That is, an amount of light transmitted through the polarizing plate on the display screen side out of the light emitted from the backlight unit and transmitted through the liquid crystal panel is changed. The orientation direction of liquid crystal is changed in accordance with the applied display voltage. Hence, the display voltage is controlled to thereby change an amount of light transmitted through the polarizing plate on the display screen side. That is, different display voltages are applied to the pixels to thereby display a desired image.

Further, an anode electrode as the pixel electrode and a cathode electrode as the opposing electrode are formed on the TFT array substrate 100 in the organic EL display device. Further, an organic layer is formed between the anode electrode and the cathode electrode. Incidentally, whether the pixel electrode is an anode electrode or a cathode electrode can be appropriately determined based on optical design.

A current is supplied between the anode electrode and the cathode electrode, by which holes from the anode electrode and electrons from the cathode electrode are injected to the organic layer and recombined. Molecules of a luminescent compound in the organic layer are excited by an energy generated at this time. The excited molecules are deactivated to a ground state, and the organic layer emits light in this process. Then, light emitted from the organic layer exits toward the display screen side. Each pixel controls an amount of light emitted from the light emitting layer based on signals from the driving circuit to display an image with the display region.

Figure 2A:
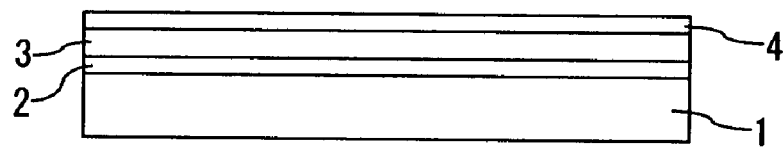
FIGS. 2A to 2C are schematic sectional views of a manufacturing method of a semiconductor thin film according to an embodiment of the present invention.
Figure 2B:
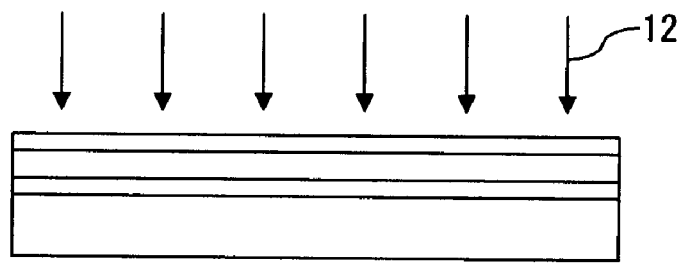
Figure 2C:
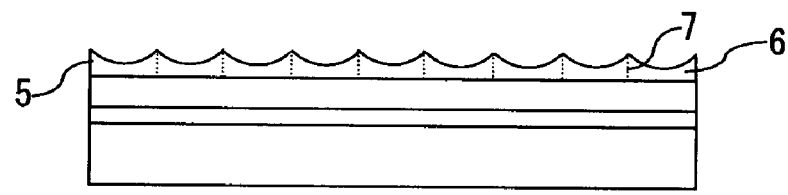

A semiconductor thin film is used to manufacture the TFT 108 on the TFT array substrate. Referring to FIGS. 2A to 2C, a method of forming the semiconductor thin film of this embodiment is described next. FIGS. 2A to 2C is a schematic sectional view of a method of forming the semiconductor thin film of this embodiment.

First, a base film is formed by CVD on a transparent insulating substrate 1 such as a glass substrate or a quartz substrate. The base film is a silicon nitride film (SiN film) or a silicon oxide film ($SiO_2$ film) as a transparent insulating film. This film is used as a base film, and the semiconductor thin film is formed later on the base film. In this embodiment, the SiN film 2 is formed with the thickness of 40 to 60 nm on the glass substrate, and the $SiO_2$ film 3 is formed thereon with the thickness of 180 to 220 nm. In other words, the base film has a laminate structure composed of the SiN film 2 and the $SiO_2$ film 3. Such base film is formed to prevent movable ions such as Na from diffusing from the glass substrate to the semiconductor thin film, and is not limited to the above film thickness. Further, the film is not limited to the above structure.

The amorphous semiconductor thin film 4 is next formed on the base film by CVD. In this embodiment, a silicon film (Si film) is used as the amorphous semiconductor thin film 4. Further, the Si film is formed with the thickness of 30 to 100 nm, preferably, 60 to 80 nm. The base film and the amorphous semiconductor thin film 4 are desirably formed successively in the same device or chamber. As a result, contaminants in the ambient atmosphere such as boron can be prevented from being introduced to the boundary between films.

Incidentally, annealing is preferably performed at high temperature after the formation of the amorphous semiconductor thin film 4. The annealing is carried out to reduce hydrogen that is contained in large amounts in the amorphous semiconductor thin film 4 formed by CVD. In this embodiment, a chamber kept under rough vacuum in a nitrogen atmosphere is heated at about 480° C. and the substrate having the amorphous semiconductor thin film 4 formed thereon is kept in the chamber for 45 minutes. If such processing is performed, hydrogen is not abruptly desorbed even if temperature is raised at the time of crystallizing the amorphous semiconductor thin film 4. It is possible to suppress surface roughness of the amorphous semiconductor thin film 4. Through the above steps, the structure of FIG. 2A is obtained.

Then, a spontaneous oxidized film formed on the amorphous semiconductor thin film 4 surface is etched off with a hydrofluoric acid. Next, while a nitrogen gas or the like is sprayed to the amorphous semiconductor thin film 4, laser light 12 is applied onto the amorphous semiconductor thin film 4 as shown in FIG. 2B. The laser light 12 is converted to a linear beam shape through a predetermined optical system and then applied to the amorphous semiconductor thin film 4. In this embodiment, second harmonics of YAG laser (oscillation wavelength: 532 nm) are used as the laser light 12. Further, conventional second harmonics of YAG laser (YAG-2ω laser) are linearly-polarized light. The laser light 12 in this example is circularly-polarized. Further, the laser light 12 is applied under the conditions of a spot size of about 60 μm×100 mm, a linear beam shape, and an irradiation energy density of 370 $mJ/cm^2$. Then, the amorphous semiconductor thin film 4 is scanned with the laser light 12 in the direction vertical to the linear beam longitudinal direction at a feed pitch of 2 μm. Incidentally, in this embodiment, a pulse laser is preferred. Further, an excimer laser may be used in place of the YAG-2ω laser. In general, laser light of the excimer laser is applied in a non-polarized state where variously polarized lights coexist. In this embodiment, even if the excimer laser is used, the laser light 12 is circularly polarized. Incidentally, an appropriate irradiation energy density is not limited to 370 $mJ/cm^2$. For example, the appropriate irradiation energy density is changed in accordance with the structure of the base film of the amorphous semiconductor thin film 4. This is because light components reflected by the base film out of the laser light 12 applied over the amorphous semiconductor thin film 4 vary in accordance with the base film thickness. The amorphous semiconductor thin film 4 is heated with the lights reflected by the base film, so the appropriate irradiation energy density varies in accordance with the structure of the base film. Moreover, the appropriate irradiation energy density is changed in accordance with a beam profile of the laser light 12 as well. The appropriate irradiation energy density ranges from, for example, 360 to 380 $mJ/cm^2$ in view of the above.

If the above laser light 12 is applied, the amorphous semiconductor thin film 4 is scanned once to thereby form the polycrystalline semiconductor thin film 5 having the crystal grains 6 arranged in a lattice shape at almost regular intervals. Here, the crystal grain 6 means a portion surrounded by the crystal grain boundaries 7 that are ridged by growing crystals colliding against each other when the laser light 12 is applied. Incidentally, the polycrystalline semiconductor thin film 5 of this embodiment is a polysilicon film (p-Si film). Through the above steps, the structure of FIG. 2C is obtained.

Figure 3:
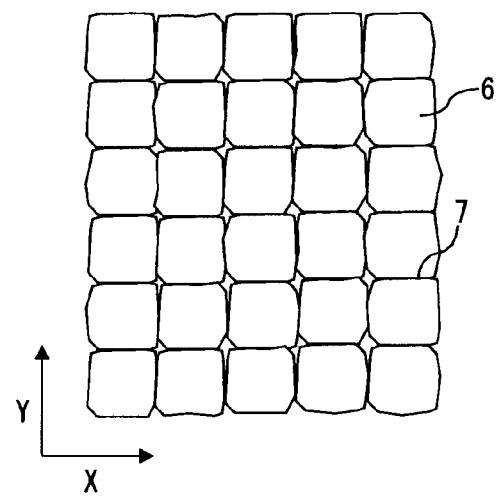
FIG. 3 is a schematic plan view of a semiconductor thin film according to the embodiment of the present invention.

Incidentally, FIG. 3 is a schematic plan view of the polycrystalline semiconductor thin film 5 formed in this embodiment. As shown in FIG. 3, the crystal grain boundaries 7 are formed in a grid shape at an interval of about $\lambda/2$. That is, the grid interval depends on the oscillation wavelength $\lambda$ of the laser light 12. Further, as described above, a portion surrounded by the crystal grain boundaries 7 corresponds to the crystal grain 6, and the size of the crystal grain 6 is equivalent to the grid interval, which is $\lambda/2$ (about ½ of the oscillation wavelength $\lambda$). That is, the crystal grains 6 are arranged in a lattice shape with substantially uniform size. In this embodiment, a YAG-2ω laser (oscillation wavelength: 532 nm) is used, so a pitch between the crystal grain boundaries 7 is about 260 nm. That is, a grid interval is 260 nm, and a size of the crystal grain 6 is also 260 nm. Incidentally, the Y direction of FIG. 3 is a laser irradiation scan direction, and the X direction is an arrangement direction of the crystal grains 6. That is, the arrangement direction of the crystal grains 6 that are arrayed in a lattice shape is vertical to the laser irradiation scan direction as shown in FIG. 3.

Further, the laser light 12 is applied while a nitrogen gas is sprayed to the amorphous semiconductor thin film 4. As a result, a ridge height of the crystal grain boundary 7 can be controlled. In this embodiment, an average roughness Ra of the crystal can be suppressed down to 3 nm or less. Further, the maximum roughness Rmax can be reduced to 30 nm or less. As mentioned above, the surface roughness of the polycrystalline semiconductor thin film 5 is small enough, so planarization processing for reducing surface roughness can be omitted.

The principle that the crystal grain boundaries 7 are formed at substantially regular intervals is as follows. When a molten semiconductor is crystallized, the crystal grain boundary is ridged. According to the technique of "AM-LCD2000" (Y. Nakata, A. Shimoyama and S. Horita, p 265-268), the laser light 12 is scattered by the ridged portion. Thus, heat input distribution is increased at the pitch of the wavelength $\lambda$ due to the scattered light. As a result, temperature is increased at the ridged portion, so the ridged portion is increased. If repetitive pulse laser light is applied, the crystal grain boundary 7 is easily generated at the pitch of $\lambda$. On the other hand, if laser is applied at pulse energy enough to melt the polycrystalline semiconductor thin film 5 to the bottom, crystal having a size of 0.1 to 0.3 µm is easily generated. This is because a cooling-down period of several tens of nsec is necessary for the silicon molten after irradiation with the laser light 12 to solidify. Hence, the crystal growth speed is several m/s or lower, and a size of the generated crystal is 0.1 to 0.3 µm. Accordingly, the crystal grain boundaries 7 are formed also at the central portion of the crystal grain boundaries 7 at the pitch of $\lambda$=532 nm. The crystal grain boundaries 7 are formed at the pitch of $\lambda$ at the central portion of the crystal grain boundaries 7. Hence, two lines of crystal grain boundaries 7 arranged at the pitch of $\lambda$ overlap with each other at a pitch of $\lambda/2$. That is, the crystal grain boundaries 7 are generated at the pitch of ½$\lambda$ (0.26 µm) of the wavelength $\lambda$=532 nm of YAG-2ω laser.

Figure 4:
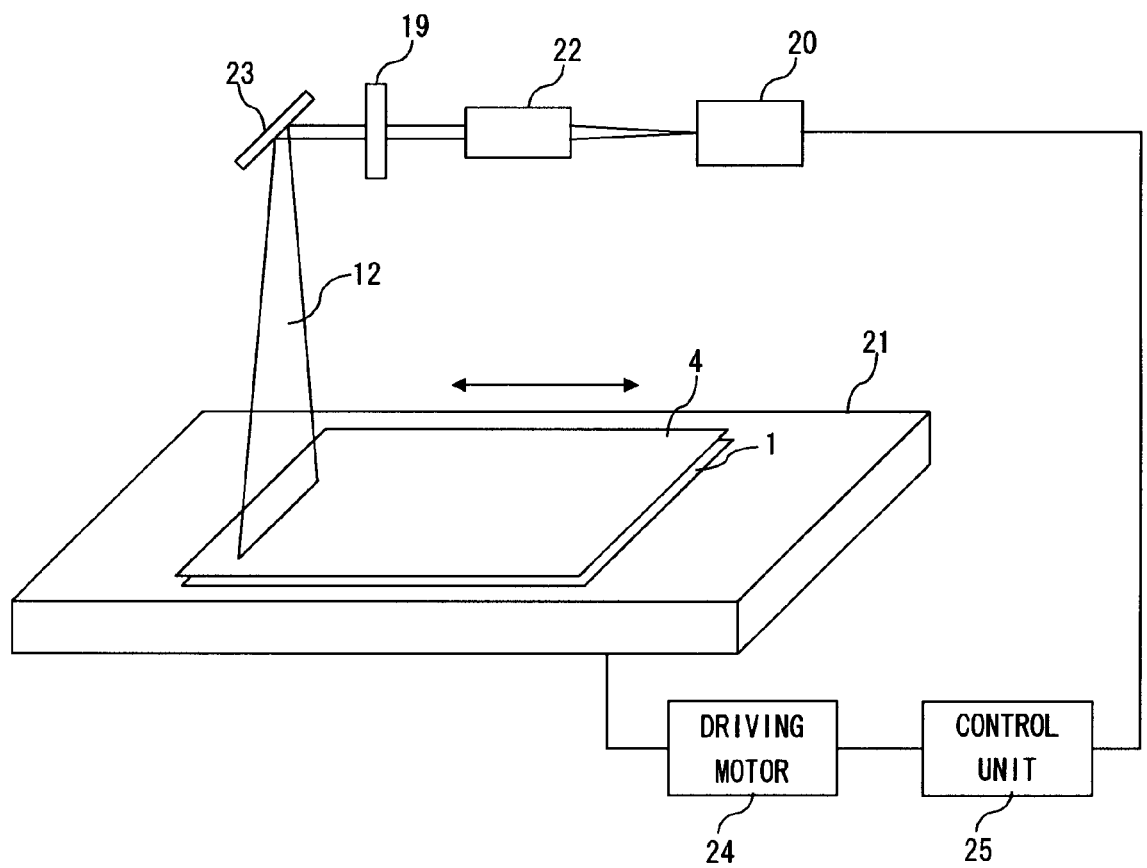
FIG. 4 is a schematic diagram of the structure of a laser annealing device according to the embodiment of the present invention.

Referring next to FIG. 4, description is given of a manufacturing device of a semiconductor thin film that is crystallized by irradiating the amorphous semiconductor thin film of this embodiment with the laser light 12. Here, a laser annealing device is used as the manufacturing device of a semiconductor thin film. FIG. 4 is a schematic diagram of the structure of the laser annealing device.

The laser annealing device includes a $\lambda/4$-wavelength plate 19 (a quarter wavelength plate) as a circular polarizing element and a laser light emitting device 20. Further, the device includes a stage 21, a beam-shaping optical system 22, a mirror 23, a driving motor 24, and a control unit 25. Further, the insulating substrate 1 having the amorphous semiconductor thin film 4 formed thereon is placed on the stage 21. The laser light emitting device 20 emits the laser light 12. Here, the laser light 12 of the YAG-2ω laser is emitted as described above. Further, the laser light 12 is linearly-polarized light at this stage. Then, the laser light 12 emitted from the laser light emitting device 20 enters the beam-shaping optical system 22. The beam-shaping optical system 22 includes an aperture, a slit, or a lens, by which a beam spot of the laser light 12 can be shaped into an appropriate shape. The light incident on the beam-shaping optical system 22 is emitted to the $\lambda/4$-wavelength plate 19. Then, the $\lambda/4$-wavelength plate 19 circularly polarizes the incident laser light 12. Incidentally, if the laser light 12 can be circularly polarized, the $\lambda/4$-wavelength plate 19 may not be used. For example, the circularly-polarizing plate may be used. Then, the circularly-polarized laser light 12 is reflected by the mirror 23 toward the amorphous semiconductor thin film 4. In this way, the laser light 12 is applied onto the amorphous semiconductor thin film 4. That is, the laser light 12 emitted from the laser light emitting device 20 is applied through the $\lambda/4$-wavelength plate 19. As a result, the circularly polarized laser light 12 is applied to the amorphous semiconductor thin film 4 formed on the insulating substrate 1. In this embodiment, the laser light 12 of the YAG-2ω laser is circularly polarized and applied onto the amorphous semiconductor thin film 4. Further, the driving motor 24 is controlled by the control unit 25 and moves the stage 21. As a result, the stage 21 is moved in parallel to the surface on which the insulating substrate 1 is placed. The stage 21 is moved such that the laser light 12 is applied to a desired position of the amorphous semiconductor thin film 4. Then, the stage 21 is moved in the longitudinal direction of the stage 21, that is, the direction of the arrow of FIG. 4. That is, the direction of the arrow of FIG. 4 is a laser irradiation scan direction. If the laser light 12 is applied, the amorphous semiconductor thin film 4 is crystallized into the polycrystalline semiconductor thin film 5. Incidentally, according to the manufacturing device of a semiconductor thin film of this embodiment, the crystal grains 6 of the polycrystalline semiconductor thin film 5 are arranged in a lattice shape, and the size of the crystal grain 6 is about half the oscillation wavelength $\lambda$ of the laser light 12.

Figure 5:
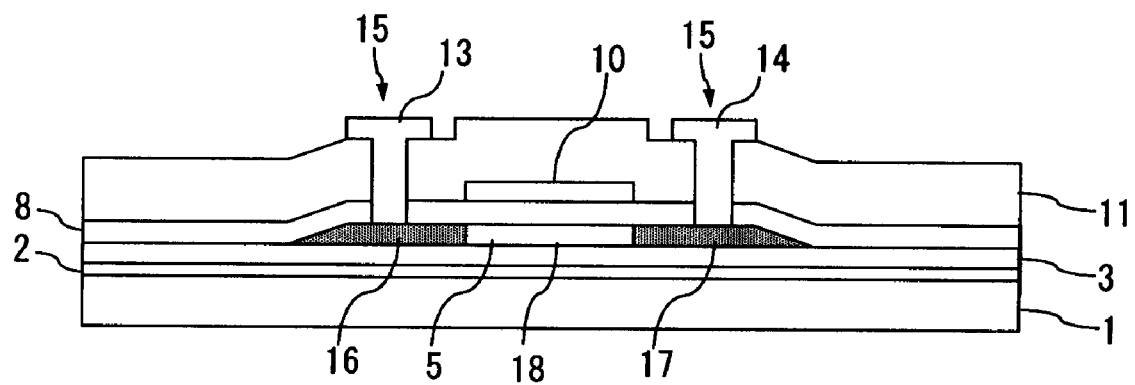
FIG. 5 is a schematic sectional view of the structure of a TFT according to the embodiment of the present invention.

Referring next to FIG. 5, the structure of the TFT 108 including the semiconductor thin film is described. FIG. 5 is a schematic sectional view of the structure of the TFT 108.

The SiN film 2 and the $SiO_2$ film 3 as a transmissive insulating film are laminated on the insulating substrate 1 to form a base film. Then, the polycrystalline semiconductor thin film 5 is formed on the base film. As shown in FIG. 2, the film is formed by irradiating the amorphous semiconductor thin film 4 with the laser light 12. Incidentally, detailed description about the forming method is given above in the description of the semiconductor thin film. The semiconductor thin film is formed as above.

Further, the polycrystalline semiconductor thin film 5 includes a conductive region containing impurities. The conductive region serves as the source region 16 and the drain region 17. A region between the source/drain regions is the channel region 18. Further, the channel region 18 extends in almost the same direction of the direction of the crystal grains 6 that are arranged in a lattice shape. Incidentally, the polycrystalline semiconductor thin film 5 is tapered at the end portions. Thus, the gate insulating film 8 formed on the polycrystalline semiconductor thin film 5 covers the film 5 with high coverage. Accordingly, defects such as breakdown can be well suppressed to increase reliability of the TFT 108.

Further, the gate insulating film 8 as an insulating layer is formed to cover these. More specifically, the gate insulating film 8 is formed in contact with the polycrystalline semiconductor thin film 5. Then, the gate electrode 10 is formed on the gate insulating film 8 opposite to the channel region 18. The interlayer insulating film 11 is formed to cover the electrode. Further, a contact hole 15 is formed in the interlayer insulating film 11 and the gate insulating film 8 opposite to the source region 16 and the drain region 17. Then, the source electrode 13 is formed in the source region 16 and is connected with the polycrystalline semiconductor thin film 5 through the contact hole 15. Further, the drain electrode 14 is formed in the drain region 17 and connected with the polycrystalline semiconductor thin film 5 through the contact hole 15. The TFT 108 including the semiconductor thin film according to this embodiment is structured as above.

Further, as described above, a liquid crystal display device, an organic EL display device, or the like may be manufactured with the TFT 108 of this embodiment. An insulating film having a contact hole is formed on the drain electrode 14 of the TFT 108 in the liquid crystal display device. Then, the pixel electrode is formed on the insulating film and connected with the drain electrode 14 through the contact hole. A planarization film having a contact hole is formed on the drain electrode 14 of the TFT 108 in the organic EL display device. Then, the anode electrode is formed on the planarization film and connected with the drain electrode 14 through the contact hole.

Referring next to FIGS. 6A to 6F, a method of manufacturing the TFT 108 including the semiconductor thin film is described in detail below. FIGS. 6A to 6F are schematic sectional views of a manufacturing method of the TFT 108 of this embodiment.

Figure 6A:
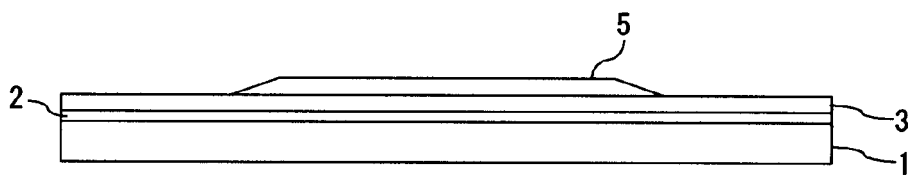
FIGS. 6A to 6F are schematic sectional views of a manufacturing method of a TFT according to the embodiment of the present invention.

First, as described above, the SiN film 2, the $SiO_2$ film 3, and the amorphous semiconductor thin film 4 are formed successively on the insulating substrate 1. Then, the amorphous semiconductor thin film 4 is turned into the polycrystalline semiconductor thin film 5 including the crystal grains 6 arranged in a lattice shape by the above method (FIG. 2C). Then, a known photoengraving process of applying a photoresist as a photosensitive resin onto the polycrystalline semiconductor thin film 5 by spin-coating, and exposing and developing the photoresist is carried out. As a result, the photoresist is patterned into a predetermined shape. After that, the polycrystalline semiconductor thin film 5 is etched to remove the photoresist pattern. As a result, the polycrystalline semiconductor thin film 5 is patterned into a desired shape. In this embodiment, the polycrystalline semiconductor thin film 5 is formed in an island-like shape by dry etching with a mixed gas of $CF_4$ and $O_2$. Further, an etching gas contains $O_2$, so the photoresist formed with the photoengraving process can be etched back. Accordingly, the polycrystalline semiconductor thin film 5 can be tapered at end portions. Through the above steps, the structure of FIG. 6A is obtained.

Figure 6B:
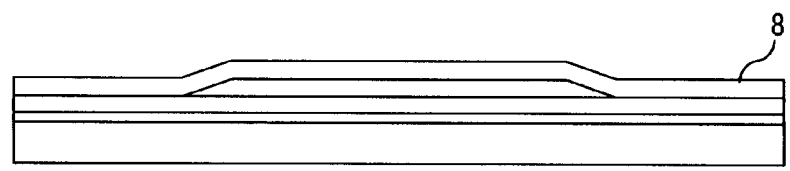

Next, the gate insulating film 8 is formed to cover the entire surface of the substrate. That is, the gate insulating film 8 is formed on the polycrystalline semiconductor thin film 5. Further, as the gate insulating film 8, an SiN film, an $SiO_2$ film, or the like is used. In this embodiment, an $SiO_2$ film is used as the gate insulating film 8 and formed with the thickness of 50 to 100 nm by CVD. Further, the polycrystalline semiconductor thin film 5 has the surface roughness Ra≦3 nm, and the maximum roughness Rmax≦30 nm. Further, the polycrystalline semiconductor thin film 5 pattern is tapered at end portions. Thus, a coverage of the gate insulating film 8 is high, and an initial failure can be considerably reduced. Through the above steps, the structure of FIG. 6B is obtained.

Figure 6C:
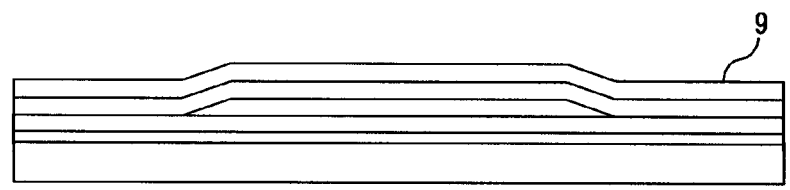

Next, the first conductive film 9 for forming the gate electrode and line is formed. The first conductive film 9 may be a film Mo, Cr, W, Al, Ta, or an alloy mainly containing thereof. In this embodiment, Mo is deposited to the film thickness of 200 to 400 nm by sputtering with a DC magnetron to form the first conductive film 9. Through the above steps, the structure of FIG. 6C is obtained.

Next, the formed first conductive film 9 is patterned into a desired shape by a known photoengraving process to form the gate electrode 10 and the line. In this embodiment, the gate electrode 10 is etched by wet etching with a phosphoric acid-based etchant. Further, dry etching may be performed with a mixed gas of $SF_6$ and $O_2$. Here, the gate electrode 10 extends along the arrangement direction of the crystal grains 6 in the polycrystalline semiconductor thin film 5, which are arrayed in a lattice shape with substantially uniform size. That is, the channel region 18 extends in substantially the same direction as the arrangement direction of the crystal grains 6 that are arrayed in a lattice shape. As a result, the size or number of crystal grains 6 in the channel of the TFT 108 can be uniformized. Hence, an effect of suppressing variations in TFT characteristics due to nonuniformity of the crystal grains 6 in the channel can be further increased.

Figure 6D:
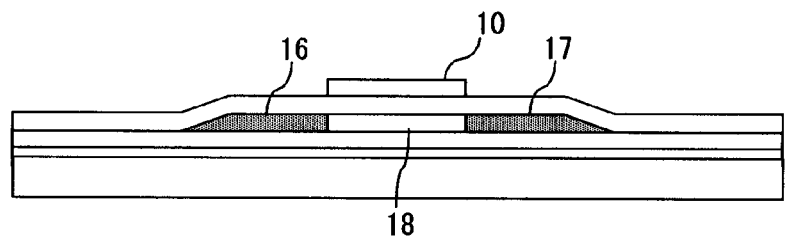

Next, impurity elements are introduced to the source/drain regions of the polycrystalline semiconductor thin film 5 with the formed gate electrode 10 used as a mask. As the introduced impurity element, P and B can be used. If P is introduced, an n-type TFT 108 can be formed. If B is introduced, a p-type TFT 108 can be formed. Further, if the gate electrode 10 is processed in two steps for forming an n-type TFT gate electrode and a p-type TFT gate electrode, the n-type TFT 108 and the p-type TFT 108 can be formed on the same substrate. Here, an impurity element such as P or B is introduced by ion doping. Through the above steps, the gate electrode 10, the source region 16, and the drain region 17 are formed, and the structure of FIG. 6D is obtained.

Next, the interlayer insulating film 11 is formed to cover the entire substrate surface. That is, the interlayer insulating film 11 is formed on the gate electrode 10. In this embodiment, the interlayer insulating film 11 is formed with an $SiO_2$ film having the thickness of 500 to 1000 nm by CVD. Then, the substrate is held in an annealing furnace heated at 450° C. under a nitrogen atmosphere for about 1 hour. This is to further activate an impurity element introduced to the source/drain regions of the polycrystalline semiconductor thin film 5.

Figure 6E:
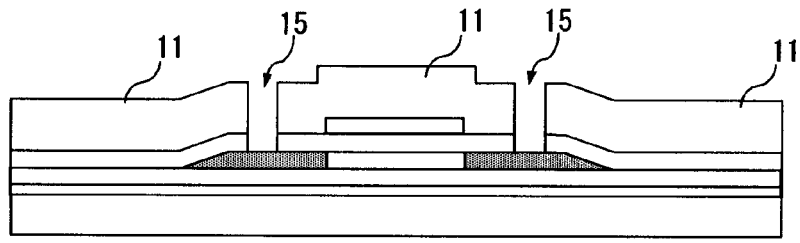

Next, the formed gate insulating film 8 and interlayer insulating film 11 are patterned into a desired shaped by a known photoengraving process. Here, the contact holes 15 are formed to reach the source region 16 and the drain region 17 of the polycrystalline semiconductor thin film 5. That is, the gate insulating film 8 and the interlayer insulating film 11 in the contact hole 15 are removed to expose the polycrystalline semiconductor thin film 5. In this embodiment, the contact hole 15 is etched by dry etching with a mixed gas of $CHF_3$, $O_2$, and Ar. Through the above steps, the structure of FIG. 6E is obtained.

Next, a second conductive film for forming the source/drain electrodes and lines is formed. The second conductive film may be a film Mo, Cr, W, Al, Ta, or an alloy mainly containing thereof. Further, these may be laminated to obtain a multi-layer structure. In this embodiment, a laminate of Mo/Al/Mo is employed. As for the film thickness, an Al film has the thickness of 200 to 400 nm, Mo films overlying and underlying the Al film have the thickness of 50 to 150 nm. These films are formed by sputtering with a DC magnetron.

Figure 6F:
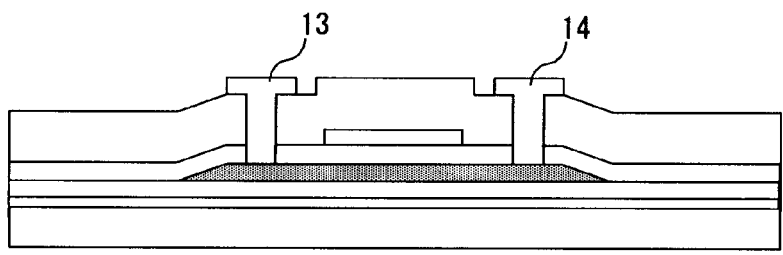

Next, the second conductive film thus formed is patterned into a desired shape by a known photoengraving process to form the source/drain electrodes and lines. In this embodiment, etching for forming the source/drain electrodes and lines is dry etching with a mixed gas of $SF_6$ and $O_2$ and a mixed gas of $Cl_2$ and Ar. Through the above steps, the source electrode 13 to be connected with the polycrystalline semiconductor thin film 5 is formed in the source region 16. Further, the drain electrode 14 to be connected to the polycrystalline semiconductor thin film 5 is formed in the drain region 17. Thus, the structure of FIG. 6F is obtained.

Through these series of steps, the TFT 108 can be manufactured. Further, the TFT 108 manufactured according to this embodiment uses the polycrystalline semiconductor thin film 5 having the crystal grains 6 that are arrayed at almost regular intervals in a lattice shape. That is, the crystal grains 6 of substantially uniform size are arranged in line. It is possible to equalize the size or number of crystal grains 6 in the channel of the thus-manufactured TFT 108. Hence, variations in TFT characteristics due to nonuniformity of the crystal grains 6 in the channel, which have been hitherto reported, can be suppressed. Further, a crystal size is set to about ½ of the laser oscillation wavelength, so carries accelerated by an externally applied electric field are hardly ionized by collision. Thus, electron injection into the gate insulating film 8 is suppressed to improve the reliability of the TFT 108. Further, holes accumulated at the bottom of the polycrystalline semiconductor thin film 5 is suppressed to thereby improve source/drain breakdown voltage of the TFT 108. Further, the surface roughness of the polycrystalline semiconductor thin film 5 is small, an effect of reducing an initial failure due to the breakdown of the gate insulating film 8 is achieved. Thus, a TFT having high saturation characteristics of Id-Vd characteristics and high reliability can be obtained.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A semiconductor thin film, comprising:
   a polycrystallized semiconductor thin film formed by applying laser light to an amorphous semiconductor thin film; and
   crystal grains arranged into a lattice shape with a size that is about ½ of an oscillation wavelength of the laser light wherein an average roughness of a surface of the polycrystallized semiconductor thin film is 3 nm or less.

2. The semiconductor thin film according to claim 1, wherein the polycrystallized semiconductor thin film is formed with a polysilicon film.

3. The semiconductor thin film according to claim 1, wherein an arrangement direction of the crystal grains arranged in a lattice shape is vertical to a laser irradiation scan direction.

4. A thin film transistor comprising the semiconductor thin film according to claim 1.

5. The thin film transistor according to claim 4, wherein a channel extends in substantially the same direction as the crystal grains arranged in a lattice shape.

6. A method of manufacturing a semiconductor thin film, comprising:
   forming an amorphous semiconductor thin film over a substrate; and
   irradiating the amorphous semiconductor thin film with laser light to form a polycrystallized semiconductor thin film including crystal grains arranged into a lattice shape with a size that is about ½ of an oscillation wavelength of the laser light wherein an average roughness of a surface of the polycrystallized semiconductor thin film is 3 nm or less.

7. The method of manufacturing a semiconductor thin film according to claim 6, wherein the laser light is second harmonics of an Nd:YAG laser.

8. The method of manufacturing a semiconductor thin film according to claim 6, wherein the polycrystallized semiconductor thin film is formed with a polysilicon film.

9. The method of manufacturing a semiconductor thin film according to claim 6, wherein an arrangement direction of the crystal grains arranged in a lattice shape is vertical to a laser irradiation scan direction.

10. The method of manufacturing a semiconductor thin film according to claim 6, wherein the laser light is circularly polarized.

11. A method of manufacturing a thin film transistor which uses the method of manufacturing a semiconductor thin film according to claim 6.

12. The method of manufacturing a thin film transistor according to claim 11, wherein a channel extends in substantially the same direction as the crystal grains arranged in a lattice shape.

13. A manufacturing device of a semiconductor thin film, comprising:
    a laser light emitting device applying laser light to an amorphous semiconductor thin film to arrange crystal grains in a polycrystallized amorphous semiconductor thin film in a lattice shape with a size that is about ½ of an oscillation wavelength of the laser light, the amorphous semiconductor thin film being polycrystallized if applied with the laser light; and
    a circular polarizing element circularly polarizing the laser light from the laser light emitting device.

14. The semiconductor thin film according to claim 1, wherein said size of the crystal grains is less than 300 nm.

15. The method of manufacturing a semiconductor thin film according to claim 6, wherein the irradiating the amorphous semiconductor thin film produces said crystal grains having said size less than 300 nm.

16. The Manufacturing device according to claim 13, wherein said size of crystal grains produced is less than 300 nm.

* * * * *